US009786660B1

(12) United States Patent
Farrell et al.

(10) Patent No.: US 9,786,660 B1
(45) Date of Patent: Oct. 10, 2017

(54) TRANSISTOR WITH BYPASSED GATE STRUCTURE FIELD

(71) Applicant: Cree, Inc., Durham, NC (US)

(72) Inventors: Donald Farrell, Raleigh, NC (US); Simon Wood, Raleigh, NC (US); Scott Sheppard, Chapel Hill, NC (US); Dan Namishia, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/073,201

(22) Filed: Mar. 17, 2016

(51) Int. Cl.
*H01L 27/118* (2006.01)
*H01L 27/088* (2006.01)
*H01L 29/40* (2006.01)
*H01L 29/423* (2006.01)
*H01L 29/417* (2006.01)

(52) U.S. Cl.
CPC .......... *H01L 27/088* (2013.01); *H01L 29/404* (2013.01); *H01L 29/41758* (2013.01); *H01L 29/4238* (2013.01)

(58) Field of Classification Search
CPC . H01L 23/4824; H01L 23/48; H01L 23/4821; H01L 23/5381; H01L 23/50; H01L 23/5286; H01L 23/481; H01L 29/41758; H01L 29/404; H01L 29/4238; H01L 27/088
See application file for complete search history.

(56) References Cited

U.S. PATENT DOCUMENTS

| | | | |
|---|---|---|---|
| 6,316,793 B1 | 11/2001 | Sheppard et al. | |
| 6,507,047 B2 | 1/2003 | Litwin | |
| 6,765,268 B2 * | 7/2004 | Akamine | H01L 23/4824 257/368 |
| 6,900,482 B2 | 5/2005 | Aoki et al. | |
| 7,135,747 B2 | 11/2006 | Allen et al. | |
| 7,851,832 B2 | 12/2010 | Takagi | |
| 7,906,799 B2 | 3/2011 | Sheppard et al. | |
| 8,536,622 B2 | 9/2013 | Takemae et al. | |
| 8,860,093 B2 | 10/2014 | Sasaki et al. | |
| 8,866,197 B2 | 10/2014 | Becker et al. | |
| 2001/0012671 A1 | 8/2001 | Hoshino et al. | |
| 2002/0033508 A1 | 3/2002 | Morikawa et al. | |
| 2002/0066908 A1 | 6/2002 | Smith | |
| 2002/0167023 A1 | 11/2002 | Chavarkar et al. | |

(Continued)

FOREIGN PATENT DOCUMENTS

EP    2 161 754 A2    3/2010

OTHER PUBLICATIONS

Notification of Transmittal of the International Search Report and the Written Opinion of the International Searching Authority, or the Declaration, for PCT Application No. PCT/US2017/022080, mailing date: May 11, 2017, 13 pgs.

*Primary Examiner* — Yosef Gebreyesus
(74) *Attorney, Agent, or Firm* — Myers Bigel, P.A.

(57) ABSTRACT

A transistor device includes a source contact extending in a first direction, a gate finger extending in the first direction adjacent the source contact, and a drain contact adjacent the gate finger, wherein the gate finger is between the drain contact and the source contact. The device further includes a gate jumper extending in the first direction, a gate bus connected to the gate jumper and the gate finger, and a gate signal distribution bar that is spaced apart from the gate bus in the first direction and that connects the gate jumper to the gate finger.

19 Claims, 5 Drawing Sheets

(56) References Cited

U.S. PATENT DOCUMENTS

| | | |
|---|---|---|
| 2003/0102482 A1 | 6/2003 | Saxler |
| 2004/0061129 A1 | 4/2004 | Saxler et al. |
| 2006/0081985 A1* | 4/2006 | Beach ................. H01L 29/0692 257/745 |
| 2009/0020848 A1 | 1/2009 | Ono et al. |
| 2009/0108357 A1 | 4/2009 | Takagi |
| 2009/0212846 A1* | 8/2009 | Cutter ................. H01L 29/4238 327/434 |
| 2011/0102077 A1 | 5/2011 | Lamey et al. |
| 2012/0012908 A1* | 1/2012 | Matsunaga ......... H01L 23/4821 257/296 |
| 2013/0313653 A1* | 11/2013 | Brech ............... H01L 29/42372 257/379 |
| 2014/0014969 A1* | 1/2014 | Kunii ...................... H01L 23/66 257/77 |

\* cited by examiner

TRANSISTOR WITH BYPASSED GATE STRUCTURE FIELD

FIELD

The inventive concepts described herein relate to microelectronic devices and more particularly to high power, high frequency transistor devices having a unit cell-based structure.

BACKGROUND

Electrical circuits requiring high power handling capability while operating at high frequencies, such as radio frequencies (500 MHz), S-band (3 GHz) and X-band (10 GHz), have in recent years become more prevalent. Because of the increase in high power, high frequency circuits, there has been a corresponding increase in demand for transistors which are capable of reliably operating at radio frequencies and above while still being capable of handling higher power loads.

To provide increased output power, transistors with a larger gate peripheries have been developed. One technique for increasing the effective gate periphery of a transistor is to provide a plurality of transistor cells that are connected in parallel. For example, a high power transistor may include a plurality of gate fingers that extend in parallel between respective elongated source and drain contacts, as illustrated in FIG. 1.

In particular, FIG. 1 illustrates a metal layout of a conventional transistor structure 10 that includes a gate pad 12, a source pad 22 and a drain pad 32 on a semiconductor structure 20. The gate pad 12 is connected by a gate bus 14 to a plurality of gate fingers 16 that extend in parallel in a first direction (e.g., the y-direction indicated in FIG. 1). The source pad 22 is connected to a plurality of parallel source contacts 26 via a source bus 24, and the drain pad 32 is connected to a plurality of drain contacts 36 via a drain bus 34. Each gate finger 16 runs along the y-direction between a pair of adjacent source and drain contacts 26, 36. A unit cell of the transistor 10 is illustrated at box 40, and includes a gate finger 16 that extends between adjacent source and drain contacts 26, 36. The gate length is dimension of the gate metallization in the x-direction, while the gate width is the distance by which the source and drain contacts 26, 36 overlap in the y-direction. That is, "width" of a gate finger 16 refers to the dimension of the gate finger 16 that extends in parallel to the adjacent source/drain contacts 26, 36. The gate periphery of the device refers to the sum of the gate widths for each gate finger 16 of the device 10.

In addition to adding unit cells, the gate periphery of a multi-cell transistor device may be increased by making the gate fingers wider (i.e., longer in the y-direction). As the gate fingers of a device become wider, however, the high frequency performance of the device may be adversely impacted. In addition, making the gate fingers wider typically means that the gate fingers must handle increased current densities, which can cause electromigration of the gate finger metallization.

SUMMARY

A transistor device according to some embodiments includes a source contact extending in a first direction, a gate finger extending in the first direction adjacent the source contact, and a drain contact adjacent the gate finger, wherein the gate finger is between the drain contact and the source contact. A gate pad is electrically connected to the gate finger at a plurality of points along the gate finger.

The device further includes a gate jumper that extends in the first direction and that is conductively connected to the gate pad. The gate pad is conductively connected through the gate jumper to at least one of the plurality of points along the gate finger.

The device may further include a gate bus connected to the gate jumper and the gate finger, and a gate signal distribution bar that is spaced apart from the gate bus in the first direction and that connects the gate jumper to the gate finger.

A transistor device according to further embodiments includes a gate pad, a gate finger in conductive contact with the gate pad at a first location on the gate finger and extending in a first direction, and a gate jumper in conductive contact with the gate pad and extending in the first direction. The gate jumper is conductively connected to the gate finger at a second location on the gate finger that is spaced apart from the first location so that a gate signal received at the gate pad is applied to the gate finger at the first location and at the second location.

A transistor device according to further embodiments includes a gate bus, a gate finger in contact with the gate bus and extending in a first direction, and a gate jumper in contact with the gate bus and extending in the first direction, wherein the gate jumper is in conductive contact with the gate finger at a location along the gate finger that is spaced apart from the gate bus in the first direction.

A transistor device according to further embodiments includes a substrate, a gate bus on the substrate, and first and second source contact segments on the substrate and extending in a first direction. The first and second source contact segments are separated from one another in the first direction by a gap. The device further includes a gate finger on the substrate and connected to the gate bus. The gate finger extends in the first direction adjacent the source contact segments. The device further includes a drain contact on the substrate adjacent the gate finger, wherein the gate finger is between the drain contact and the source contact segments, a gate jumper connected to the gate bus, wherein the gate jumper is provided above the source contact segments and extends in the first direction, and a gate signal distribution bar on the substrate and extending from the gap between the first and second source contact segments to the gate finger. The gate signal distribution bar contacts the gate finger at a gate signal distribution point that is spaced apart from the gate bus in the first direction, and the gate signal distribution bar is conductively connected to the gate jumper.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Embodiments of the present inventive concepts now will be described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the inventive concepts provide multi-cell transistor devices with large effective gate widths. By feeding the gate signal to the gate fingers at multiple locations along the width of the gate finger, the high frequency gain performance and electromigration concerns normally associated with wide gate fingers can be improved. According to some embodiments, a larger gate width of a multi-cell transistor device can be accommodated by adding a second layer of metal above the source regions of a cell to act as a gate jumper. The gate jumper is connected to the gate finger at various locations along the gate finger, effectively dividing the gate finger into multiple segments. The gate jumper may be provided by a second layer of metal above the source contact that connects the gate pad to the gate segments. In some embodiments, the gate jumper could run above the drain contact or the gate finger instead of over the source contact.

By effectively dividing the gate into segments and distributing the gate signal to each of the segments by means of a gate jumper, the gain performance and electromigration concerns of the device can be improved.

Accordingly embodiments of the inventive concepts provide a transistor layout that defines multiple unit cells in series for each gate. Individually, each of the unit cells has a shorter effective gate width. However, when connected in series, the unit cells can increase the effective length of a single gate finger. The gate fingers of the series-connected unit cells are connected to a gate bus by means of a second metal bridge that runs above the source contacts of the unit cells. The metal bridge is connected between the source contacts to connecting bars that run along the surface of the substrate between the source contacts and connect to the gate finger.

A transistor having a layout as described herein may have higher frequency performance and higher output power while at the same time having a reduced current density, which can improve device reliability.

Figure 2:
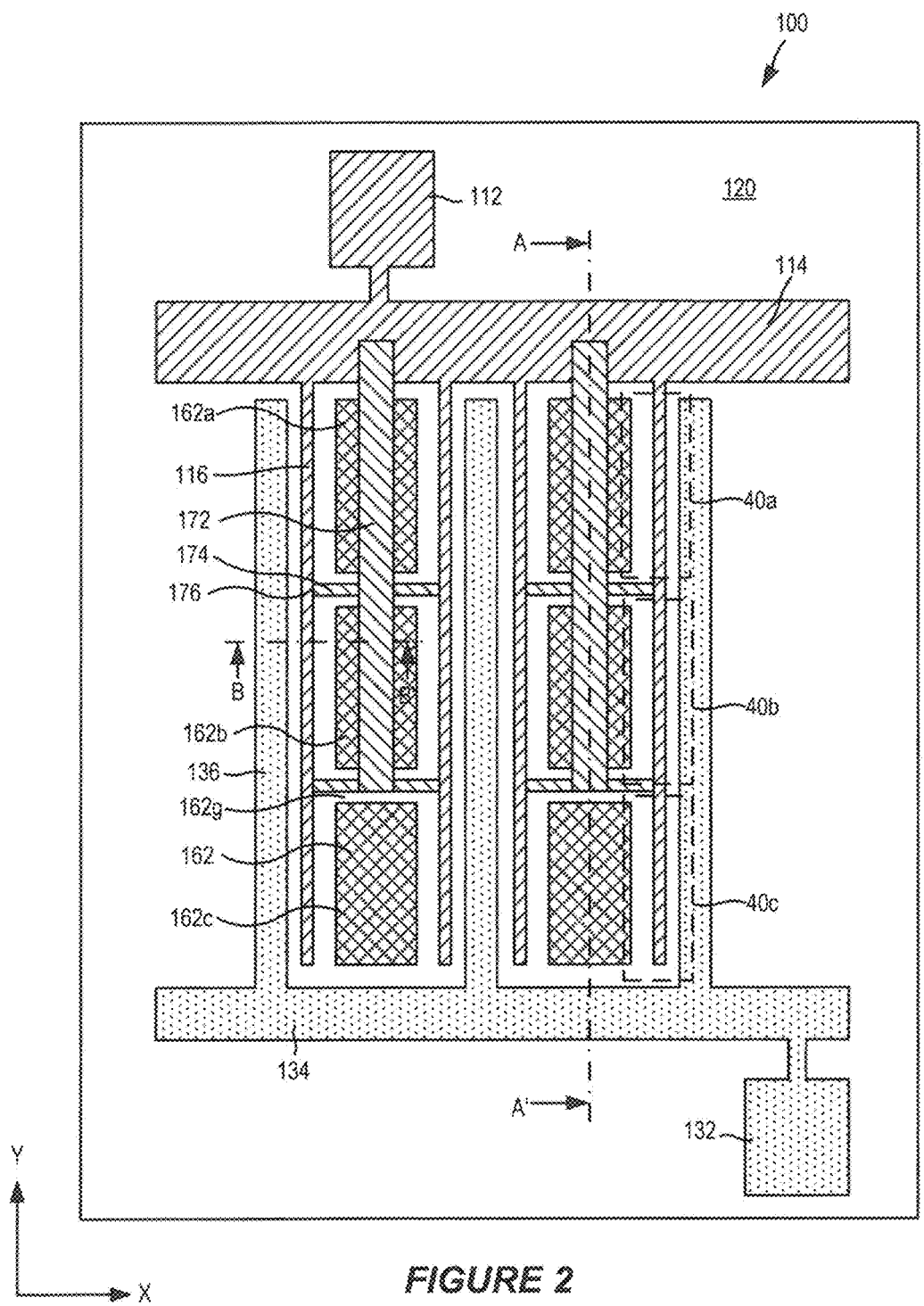
FIG. 2 is a plan view of a metal layout of a transistor in accordance with some embodiments.
Figure 5:
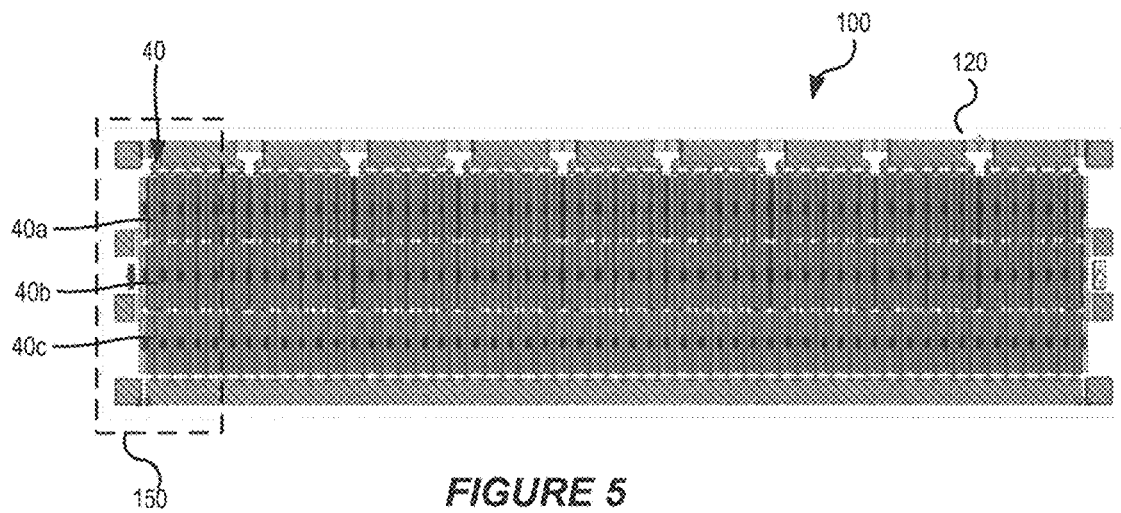
FIG. 5 is a plan view of a layout of a metal layout of a transistor in accordance with some embodiments.
Figure 6:
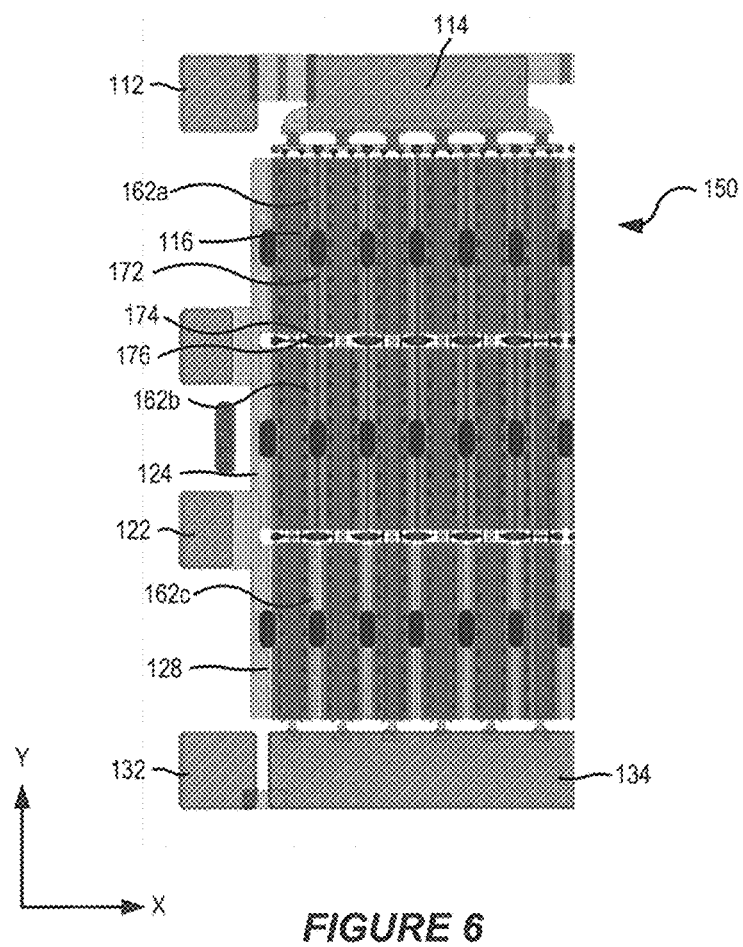
FIG. 6 is a detail plan view of a portion of a metal layout of a transistor in accordance with some embodiments.

FIG. 2 is a plan view of a metal layout of a transistor 100 in accordance with some embodiments. The transistor is formed on a semiconductor structure 120 that includes one or more device epitaxial layers which are described in greater detail below. The layout of FIG. 2 is simplified for ease of understanding and includes a gate pad 112 that is connected to a gate bus 114 and a drain pad 132 that is connected to a drain bus 134. The source pad and source bus are omitted from FIG. 2 for clarity of illustration, but are illustrated in FIGS. 5 and 6.

A plurality of gate fingers 116 are connected to the gate bus 114 and extend in the y-direction. Likewise, a plurality of drain contacts 136 are connected to the drain bus 134 and extend in parallel with and adjacent to respective ones of the gate fingers 116. Although only four gate fingers 116 and three drain contacts 136 are illustrated in FIG. 2, it will be appreciated that the transistor 100 may have many more gate fingers and source contacts so that the transistor has a large number of unit cells.

Source contacts 162 are provided in the layout and extend in the y-direction in parallel with adjacent ones of the gate fingers 116. The source contacts 162 are divided in the y-direction into respective source contact segments 162a, 162b and 162c. The source contact segments may be connected by means of source contact bars 128 (FIG. 6) that extend laterally across the device structure (in the x-direction).

Adjacent ones of the source contact segments 162a to 162c are separated by gaps 162g. Although FIG. 2 illustrates three source gate contact segments 162a-162c for each source contact 162, the inventive concepts are not limited to such a configuration, and it will be appreciated that the source contact 162 may include two or more source gate contact segments 162a-162c.

The gate fingers 116 may extend in parallel with the source contacts 162 for the entire length of the source contacts 116. However, because the source contacts 162 are divided into source contact segments 162a, 162b and 162c, the source contact segments 162a, 162b and 162c define a plurality of series unit cells 40a, 40b, 40c for each of the gate fingers 116. That is, each gate finger 116 acts as a gate contact for a plurality of unit cells 40a, 40b, 40c that are laid out in the direction (y-direction) along which the gate fingers 116 extend and that defines the width of the gate fingers 116. Thus, the total width contributed to the gate periphery of the overall device by each gate finger 116 is equal to the distance by which the gate finger 116 overlaps the adjacent source contact segments 162a, 162b and 162c in the y-direction.

The transistor 100 further includes a plurality of gate jumpers 172 that extend along the y-direction in parallel with the gate fingers 116. The gate jumpers 172 may be formed above the source contacts 162, and may be insulated from the source contacts 162 by, for example, a dielectric layer and/or an air gap. The gate jumpers 172 are electrically connected to the gate bus 114, and connect each gate finger 116 to the gate bus 114 at multiple locations along the gate finger 116.

Figure 1:
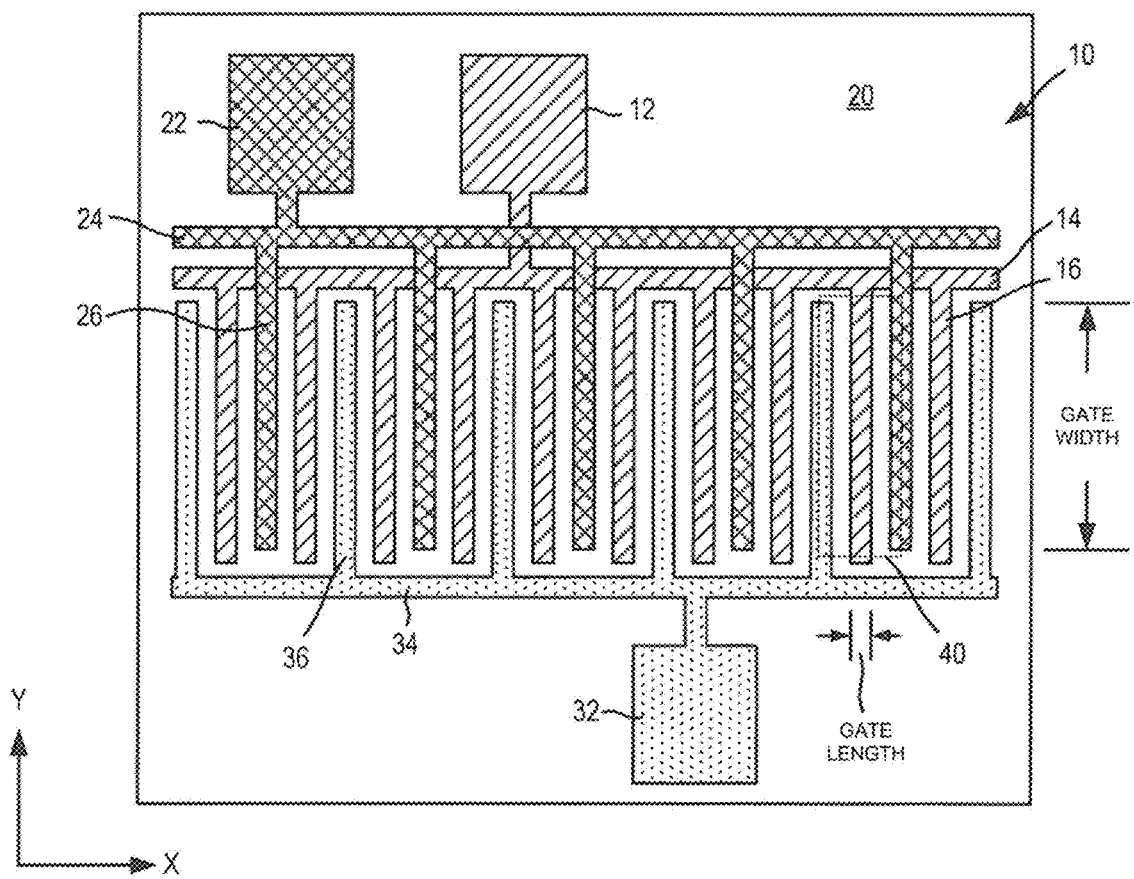
FIG. 1 is a plan view of a metal layout of a conventional multi-cell transistor.

In particular, the gate jumpers 172 connect to the gate fingers 116 through gate signal distribution bars 174 that are provided at multiple locations along the width of the device and that extend laterally (in the x-direction) from the gaps 162g between adjacent ones of the source contact segments 162a, 162b and 162c to the gate fingers 116. The gate signal distribution bars 174 contact the gate fingers 116 at gate signal distribution points 176. Thus, an electrical signal applied to the gate pad 112 (a "gate signal") is carried to the gate bus 114, and then to the gate jumpers 172, which distribute the gate signal to the gate fingers 116 at multiple locations (the gate signal distribution points 176) along the width of the gate fingers 116. Thus, in the embodiments illustrated in FIG. 1, rather than having the gate fingers 116 carry the gate signal for the entire width of the device, the gate signal is carried by the gate jumpers 172 over a large part of the width of the device and then distributed to the gate fingers 116 at various locations along the width of the device.

The gate jumpers 172 may have larger cross sectional areas than the gate fingers 116, and thus may be better able to handle higher current densities than the gate fingers without the problems normally associated with increased gate widths, such as electromigration and reduction of high frequency gain performance.

Figure 3:
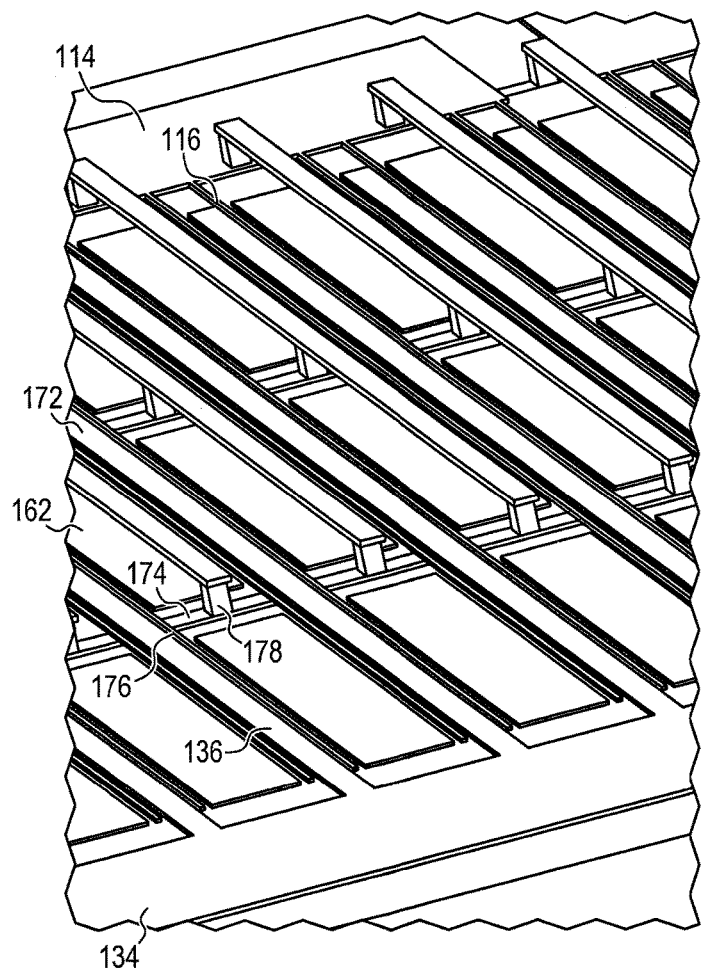
FIG. 3 is a partial isometric view of a metal layout of a transistor in accordance with some embodiments.
Figure 4:
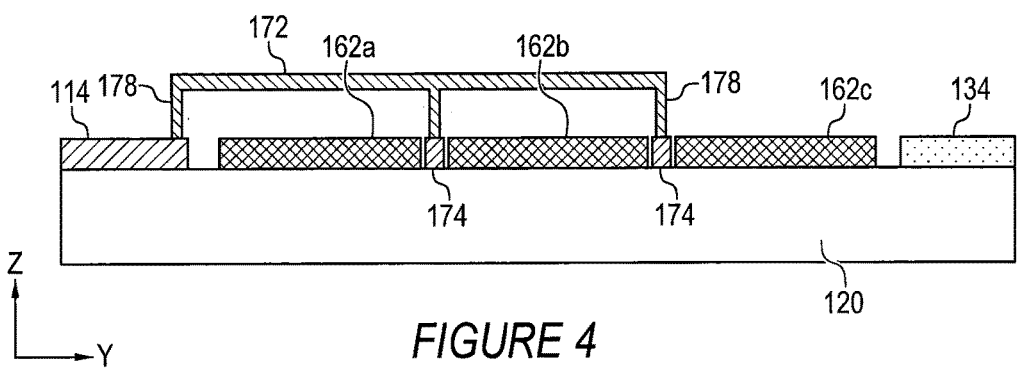
FIG. 4 is a partial cross section of a metal layout of a transistor in accordance with some embodiments taken along line A-A' of FIG. 2.

FIG. 3 is a partial isometric view of a metal layout of a transistor 100 in accordance with some embodiments, and FIG. 4 is a partial cross section of a metal layout of a transistor 100 taken along line A-A' of FIG. 2. As can be seen in FIGS. 3 and 4, the gate jumpers 172 are formed at a metal level higher than the metal level of the source contact segments 162a, 162b, 162c, the gate fingers 116, the gate bus 114 and the gate signal distribution bars 174. The gate jumpers 172 are connected to the gate bus 114 and the gate signal distribution bars 174 by vertical contact plugs 178.

The gate jumpers 172, gate bus 114, vertical contact plugs 178 and gate signal distribution bars 174 may be formed of a conductive material, such as copper or aluminum, having a very low resistance.

FIG. 5 is a plan view of a layout of a metal layout of the transistor 100 in accordance with some embodiments, and FIG. 6 is a detail plan view of a portion 150 of the metal layout of FIG. 5. The metal layout includes a plurality of unit cells 40 that extend vertically (in the y-direction). Each of the unit cells 40 includes one gate finger 116 that extends over the entire width of the device, and is subdivided into series unit cells 40a, 40b, 40c that are arranged in the vertical direction (y-direction) as described above. In the embodiments illustrated in FIGS. 5 and 6, each of the unit cells 40 has an overall width of 1120 microns, with the series unit cells 40a, 40b, and 40c having widths of 370 microns, 380 microns and 370 microns, respectively, although the inventive concepts are not limited to these particular dimensions. In this manner, the effective gate width of the device may be increased.

Referring to FIG. 6, a gate pad 112 and gate bus 114 are provided at the one end of the structure, while a drain pad 132 and drain bus 134 are provided at the other end of the structure. Source pads 122 are provided on the side of the structure and are connected to a source bus 124. The source bus 124 is connected to a plurality of source distribution bars 128 that extend in the lateral direction (x-direction) to contact the source contact segments 162a, 162b, 162c.

The detail view of the portion 150 of the device layout of the transistor 100 in FIG. 6 also illustrates the gate fingers 116, the gate jumpers 172, gate signal distribution bars 174 and the gate signal distribution points 176 where the gate signal distribution bars 174 contact the gate fingers 116.

Figure 7:
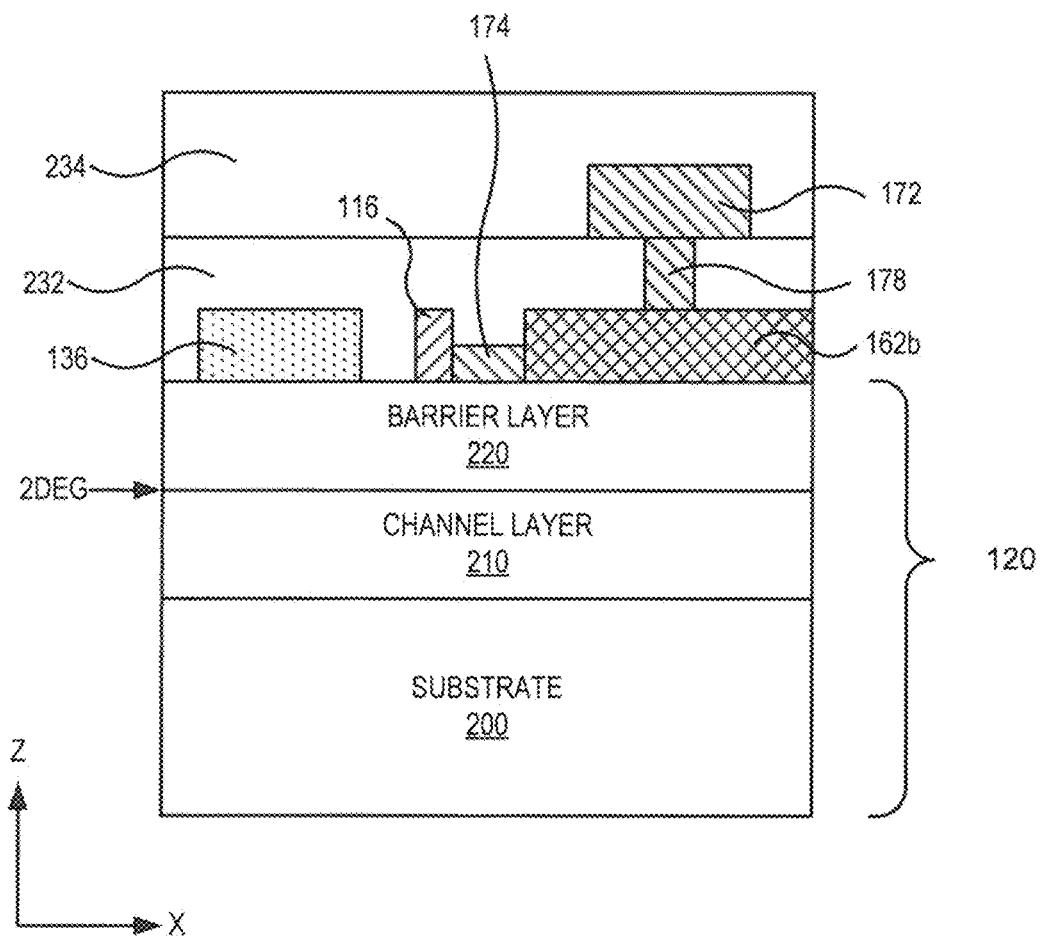
FIG. 7 is a cross-section of a unit cell of a transistor device taken along line B-B' of FIG. 2.

FIG. 7 is a cross-section of a unit cell 40 of a transistor device 100 taken along line B-B' of FIG. 2. The transistor structure 100 includes a semiconductor structure 120 including a substrate 200, which may, for example, include 4H—SiC or 6H—SiC. A channel layer 210 is formed on the substrate 210, and a barrier layer 220 is formed on the channel layer 210. The channel layer 210 and the barrier layer 220 may include Group III-nitride based materials, with the material of the barrier layer 220 having a higher bandgap than the material of the channel layer 210. For example, the channel layer 210 may comprise GaN, while the barrier layer may comprise AlGaN.

Due to the difference in bandgap between the barrier layer 220 and the channel layer 210 and piezoelectric effects at the interface between the barrier layer 220 and the channel layer 210, a two dimensional electron gas (2DEG) is induced in the channel layer 210 at a junction between the channel layer 210 and the barrier layer 220. The 2DEG is a highly conductive layer that allows conduction between the source and drain regions of the device beneath the source contact segment 162b and the drain contact 136, respectively. A source contact segment 162b and a drain contact 136 are formed on the barrier layer 220. A gate finger 116 is formed on the barrier layer 220 between the drain contact 136 and the source contact segment 162b. A gate jumper 172 is provided above the source contact segment 162b, and is connected to the gate finger 116 through a vertical contact plug 178 and a gate signal distribution bar 174. The vertical contact plug 178 and the gate signal distribution bar are provided in gaps 162g between adjacent ones of the source contact segments 162a-162c and do not physically contact the source contact segments 162a-162c.

A first interlayer insulating layer 232 is formed on the substrate over the drain contact 136, the gate finger 116, the source contact segment 162b and the gate signal distribution bar 174. The interlayer insulating layer 232 may include a dielectric material, such as SiN, $SiO_2$, etc. The vertical contact plug 178 penetrates the first interlayer insulating layer 232. The gate jumper 172 is formed on the first interlayer insulating layer 232, which insulates the gate jumper 172 from the source contact segment 162b. A second interlayer insulating layer 234 may be formed on the first interlayer insulating layer 232 and the gate jumper 172. The second interlayer insulating layer 234 may include a dielectric material, such as SiN, $SiO_2$, etc.

The material of the gate finger 116 may be chosen based on the composition of the barrier layer. However, in certain embodiments, conventional materials capable of making a Schottky contact to a nitride based semiconductor material may be used, such as Ni, Pt, $NiSi_x$, Cu, Pd, Cr, W and/or WSiN. The drain contacts 136 and source contact segments 162 may include a metal, such as TiAlN, that can form an ohmic contact to GaN.

Embodiments of the inventive concepts may be particularly well suited for use in connection with Group III-nitride based high electron mobility transistor (HEMT) devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. These compounds all have empirical formulas in which one mole of nitrogen is combined with a total of one mole of the Group II elements.

Suitable structures for GaN-based HEMTs that may utilize embodiments of the present invention are described, for example, in commonly assigned U.S. Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Publication No. 2002/0167023A1 for "Group-III Nitride Based High Electron Mobility Transistor (HEMT) With Barrier/Spacer Layer," published Nov. 14, 2002, U.S. Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

In particular embodiments of the present invention, the substrate 200 may be a semi-insulating silicon carbide (SiC) substrate that may be, for example, 4H polytype of silicon carbide. Other silicon carbide candidate polytypes include the 3C, 6H, and 15R polytypes.

Optional buffer, nucleation and/or transition layers (not shown) may be provided on the substrate 200 beneath the channel layer 210. For example, an AlN buffer layer may be included to provide an appropriate crystal structure transition between the silicon carbide substrate and the remainder of the device. Additionally, strain balancing transition layer(s) may also be provided as described, for example, in commonly assigned U.S. Publication 2003/0102482A1, published Jun. 5, 2003, and entitled "Strain Balanced Nitride Hetrojunction Transistors And Methods Of Fabricating Strain Balanced Nitride Heterojunction Transistors," the disclosure of which is incorporated herein by reference as if set forth fully herein. Moreover, one or more capping layers, such as SiN capping layers, may be provided on the barrier layer 220.

Silicon carbide has a much closer crystal lattice match to Group III nitrides than does sapphire ($Al_2O_3$), which is a very common substrate material for Group III nitride devices. The closer lattice match of SiC may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

In some embodiments of the present invention, the channel layer 210 is a Group III-nitride, such as $Al_xGa_{1-x}N$ where $0 \leq x < 1$, provided that the energy of the conduction band edge of the channel layer 210 is less than the energy of the conduction band edge of the barrier layer 220 at the interface between the channel and barrier layers. In certain embodiments of the present invention, x=0, indicating that the channel layer 210 is GaN. The channel layer 210 may also be other Group III-nitrides such as InGaN, AlInGaN or the like. The channel layer 210 may be undoped or unintentionally doped and may be grown to a thickness of greater than about 20 Å. The channel layer 210 may also be a multi-layer structure, such as a superlattice or combinations of GaN, AlGaN or the like.

The channel layer 210 may have a bandgap that is less than the bandgap of the barrier layer 220, and the channel layer 210 may also have a larger electron affinity than the barrier layer 220. In certain embodiments of the inventive concepts, the barrier layer 220 is AlN, AlInN, AlGaN or AlInGaN with a thickness of between about 0.1 nm and about 10 nm. In particular embodiments of the inventive concepts, the barrier layer 22 is thick enough and has a high enough Al composition and doping to induce a significant carrier concentration at the interface between the channel layer 210 and the barrier layer 220.

The barrier layer 220 may be a Group III-nitride and has a bandgap larger than that of the channel layer 210 and a smaller electron affinity than the channel layer 210. Accordingly, in certain embodiments of the present invention, the barrier layer 220 may include AlGaN, AlInGaN and/or AlN or combinations of layers thereof. The barrier layer 220 may, for example, be from about 0.1 nm to about 30 nm thick. In certain embodiments of the present invention, the barrier layer 220 is undoped or doped with an n-type dopant to a concentration less than about $10^{19}$ $cm^{-3}$. In some embodiments of the present invention, the barrier layer 220 is $Al_xGa_{1-x}N$ where $0<x<1$. In particular embodiments, the aluminum concentration is about 25%. However, in other embodiments of the present invention, the barrier layer 220 comprises AlGaN with an aluminum concentration of between about 5% and about 100%. In specific embodiments of the present invention, the aluminum concentration is greater than about 10%.

While embodiments of the present invention are illustrated with reference to a GaN High Electron Mobility Transistor (HEMT) structure, the present inventive concepts are not limited to such devices. Thus, embodiments of the present invention may include other transistor devices having a plurality of unit cells and a controlling electrode. Embodiments of the present invention may be suitable for use in any semiconductor device where a wider controlling electrode is desired and multiple unit cells of the device are present. Thus, for example, embodiments of the present invention may be suitable for use in various types of devices, such as, MESFETs, MMICs, SITs, LDMOS, BITs, pHEMTs, etc., fabricated using SiC, GaN, GaAs, silicon, etc.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
a source contact extending in a first direction:
a gate finger extending in the first direction adjacent the source contact;
a drain contact adjacent the gate finger, wherein the gate finger is between the drain contact and the source contact;
a gate pad connected to the gate finger; and
a gate jumper that is conductively connected to the gate pad,
wherein the gate pad is conductively connected to the gate finger at two or more points along the gate finger, and
wherein the gate pad is conductively connected through the gate jumper to at least one of the two or more points along the gate finger.

2. The transistor device of claim 1, wherein the gate jumper is provided above the source contact and is electrically insulated from the source contact.

3. The transistor device of claim 2, wherein the source contact comprises a plurality of source contact segments that are spaced apart in the first direction with a gap between first and second ones of the source contact segments;
the transistor device further comprising a gate signal distribution bar in the gap between the first and second source contact segments, the gate signal distribution bar contacting the gate finger, wherein the gate jumper is in conductive contact with the gate signal distribution bar.

4. The transistor device of claim 3, further comprising a plurality of gaps between pairs of adjacent ones of the source contact segments, and a plurality of gate signal distribution bars in respective ones of the gaps, the plurality of gate signal distribution bars contacting the gate finger at a respective plurality of contact points on the gate finger, wherein the gate jumper is in conductive contact with the plurality of gate signal distribution bars.

5. The transistor device of claim 4, further comprising a plurality of conductive plugs that connect the gate jumper to the gate signal distribution bars.

6. The transistor device of claim 3, further comprising a plurality of source contacts arranged in a second direction that is perpendicular to the first direction, wherein each of the plurality of source contacts comprises a plurality of source contact segments that are spaced apart in the first direction with gaps between adjacent ones of the source contact segments.

7. The transistor device of claim 6, further comprising a source contact bar that extends in the second direction and is conductively connected to respective ones of the source contact segments that are adjacent to one another in the second direction.

8. The transistor device of claim 1, further comprising a gate bus coupled to the gate finger and to the gate pad, wherein the gate jumper is conductively connected to the gate bus, and wherein the gate jumper is conductively connected to the gate finger at a plurality of contact points along the gate finger that are spaced apart from the gate bus in the first direction.

9. The transistor device of claim 8, further comprising a plurality of gate signal distribution bars that conductively connect the gate jumper to the gate finger at the plurality of contact points along the gate finger.

10. A transistor device, comprising:
a gate pad;
a gate finger in conductive contact with the gate pad at a first location at an end of the gate finger and extending in a first direction; and
a gate jumper in conductive contact with the gate pad and extending in the first direction;
wherein the gate jumper is conductively connected to the gate finger at a second location on the gate finger that is spaced apart from the first location so that a gate signal received at the gate pad is applied to the gate finger at the first location and at the second location.

11. The transistor device of claim 10, further comprising a source contact adjacent the gate finger, wherein the gate jumper is provided above the source contact and is electrically insulated from the source contact.

12. The transistor device of claim 11, wherein the source contact comprises a plurality of source contact segments that are spaced apart in the first direction with a gap between first and second ones of the source contact segments;
the transistor device further comprising a gate signal distribution bar in the gap between the first and second source contact segments, the gate signal distribution bar contacting the gate finger, wherein the gate jumper is in conductive contact with the gate signal distribution bar.

13. The transistor device of claim 12, further comprising a plurality of gaps between pairs of adjacent ones of the source contact segments and a plurality of gate signal distribution bars in respective ones of the gaps, the plurality of gate signal distribution bars contacting the gate finger at a respective plurality of locations on the gate finger, wherein the gate jumper is in conductive contact with the plurality of gate signal distribution bars.

14. The transistor device of claim 12, further comprising a plurality of source contacts arranged in a second direction that is perpendicular to the first direction, wherein each of the plurality of source contacts comprises a plurality of source contact segments that are spaced apart in the first direction with gaps between adjacent ones of the source contact segments.

15. The transistor device of claim 14, further comprising a source contact bar that extends in the second direction and is conductively connected respective ones of the source contact segments that are adjacent to one another in the second direction.

16. The transistor device of claim 12, wherein the gate jumper crosses above less than all of the source contact segments in the source contact.

17. The transistor device of claim 10, further comprising a gate bus coupled to the gate finger and to the gate pad, wherein the gate jumper and the gate pad are conductively connected to the gate bus.

18. The transistor device of claim 17, further comprising a plurality of gate signal distribution bars that conductively connect the gate jumper to the gate finger at a plurality of contact points along the gate finger.

19. A transistor device, comprising:
a substrate;
a gate bus on the substrate;
first and second source contact segments on the substrate and extending in a first direction, wherein the first and second source contact segments are separated from one another in the first direction by a gap;
a gate finger on the substrate and connected to the gate bus, wherein the gate finger extends in the first direction adjacent the source contact segments;
a drain contact on the substrate adjacent the gate finger, wherein the gate finger is between the drain contact and the source contact segments;
a gate jumper connected to the gate bus, wherein the gate jumper is provided above the source contact segments and extends in the first direction; and
a gate signal distribution bar on the substrate and extending from the gap between the first and second source contact segments to the gate finger, wherein the gate signal distribution bar contacts the gate finger at a gate signal distribution point that is spaced apart from the gate bus in the first direction; and
wherein the gate signal distribution bar is conductively connected to the gate jumper.

* * * * *

UNITED STATES PATENT AND TRADEMARK OFFICE
CERTIFICATE OF CORRECTION

| | |
|---|---|
| PATENT NO. | : 9,786,660 B1 |
| APPLICATION NO. | : 15/073201 |
| DATED | : October 10, 2017 |
| INVENTOR(S) | : Farrell et al. |

It is certified that error appears in the above-identified patent and that said Letters Patent is hereby corrected as shown below:

On the Title Page

Please add:
-- (65) Prior Publication Data
US 2017-0271329 A1 Sep. 21, 2017 --

In the Specification

Column 6, Line 45: Please correct "Group II elements" to read -- Group III elements --

Column 8, Line 26: Please correct "LDMOS, BITs," to read -- LDMOS, BJTs --

Signed and Sealed this
Twenty-seventh Day of February, 2018

Andrei Iancu
*Director of the United States Patent and Trademark Office*